United States Patent
Wu et al.

(10) Patent No.: US 11,329,083 B2
(45) Date of Patent: May 10, 2022

(54) WAFER LEVEL IMAGE SENSOR PACKAGE

(71) Applicant: Taiwan Semiconductor Manufacturing Co., Ltd., Hsin-Chu (TW)

(72) Inventors: Wen-Hau Wu, New Taipei (TW); Chun-Hao Chuang, Hsinchu (TW); Kazuaki Hashimoto, Zhubei (TW); Keng-Yu Chou, Kaohsiung (TW); Wei-Chieh Chiang, Yuanlin Township (TW); Cheng Yu Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 362 days.

(21) Appl. No.: 16/227,138

(22) Filed: Dec. 20, 2018

(65) Prior Publication Data
US 2020/0098808 A1 Mar. 26, 2020

Related U.S. Application Data

(60) Provisional application No. 62/736,679, filed on Sep. 26, 2018.

(51) Int. Cl.
H01L 27/146 (2006.01)

(52) U.S. Cl.
CPC .. H01L 27/14618 (2013.01); H01L 27/14621 (2013.01); H01L 27/14627 (2013.01); H01L 27/14636 (2013.01); H01L 27/14685 (2013.01)

(58) Field of Classification Search
CPC ......... H01L 27/14618; H01L 27/14621; H01L 27/14627
USPC ....................................................... 257/432
See application file for complete search history.

(56) References Cited

U.S. PATENT DOCUMENTS

| | | | |
|---|---|---|---|
| 9,497,366 B1 | 11/2016 | Boettiger et al. | |
| 2005/0077458 A1* | 4/2005 | Ma | H04N 5/2257 250/239 |
| 2009/0122178 A1* | 5/2009 | Kwon | H04N 5/2253 348/340 |
| 2010/0259657 A1* | 10/2010 | Lee | H01L 27/14625 348/294 |
| 2013/0010165 A1* | 1/2013 | Yu | H01L 27/14625 348/273 |

(Continued)

*Primary Examiner* — Lex H Malsawma
*Assistant Examiner* — Xia L Cross
(74) *Attorney, Agent, or Firm* — Eschweiler & Potashnik, LLC

(57) ABSTRACT

An image sensor package is provided. The image sensor package comprises a package substrate, and an image sensor chip arranged over the package substrate. The integrated circuit device further comprises a protection layer overlying the image sensor chip having a planar top surface and a bottom surface lining and contacting structures under the protection layer, and an on-wafer shield structure spaced around a periphery of the image sensor chip. The height of the image sensor package can be reduced since a discrete cover glass or an infrared filter and corresponding intervening materials are no longer needed since being replaced by the build in protection layer. The size of the image sensor package can be reduced since a discrete light shield and corresponding intervening materials are no longer needed since being replaced by the build in on wafer light shield structure.

20 Claims, 11 Drawing Sheets

(56) References Cited

U.S. PATENT DOCUMENTS

| | | |
|---|---|---|
| 2013/0037698 A1 | 2/2013 | Maeda |
| 2016/0163755 A1* | 6/2016 | Huang .............. H01L 27/14625 257/459 |
| 2017/0207261 A1 | 7/2017 | Ting et al. |
| 2018/0012863 A1 | 1/2018 | Yu et al. |
| 2018/0145104 A1 | 5/2018 | Kim et al. |
| 2018/0211989 A1 | 7/2018 | Hogyoku et al. |
| 2019/0074399 A1* | 3/2019 | Masuda ................ H01L 25/167 |

\* cited by examiner

WAFER LEVEL IMAGE SENSOR PACKAGE

REFERENCE TO RELATED APPLICATION

This Application claims priority to U.S. Provisional Application No. 62/736,679, filed on Sep. 26, 2018, the contents of which are hereby incorporated by reference in their entirety.

BACKGROUND

Digital cameras and optical imaging devices employ image sensors. Image sensors convert optical images to digital data that may be represented as digital images. An image sensor includes an array of pixel sensors and supporting logic. The pixel sensors of the array are unit devices for measuring incident light, and the supporting logic facilitates readout of the measurements. Image sensors often manifest as charge-coupled devices (CCDs), complementary metal oxide semiconductor (CMOS) devices, or back side illuminated (BSI) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
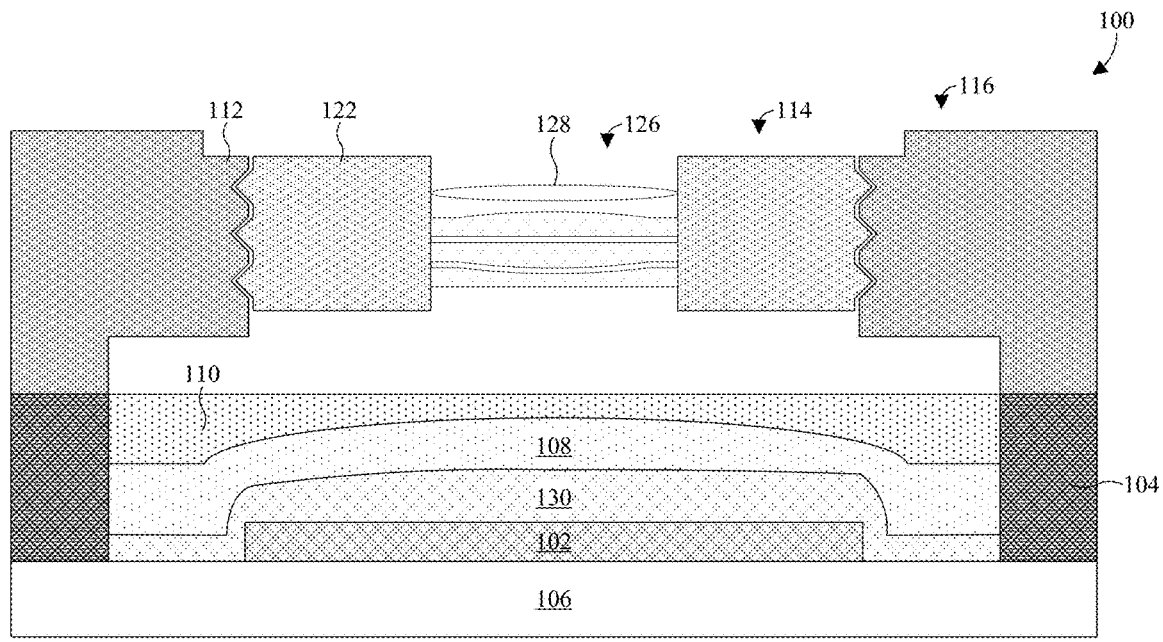
FIG. 1 illustrates a cross-sectional view of some embodiments of an image sensor package having an image sensor chip.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Image sensors are typically manufactured in bulk on bulk substrates or wafers. The dies to which the image sensors correspond are then separated or singulated to form chips, which are typically packaged for use. Packaging provides protection against impact and corrosion, contacts to connect image sensor chips to external devices, and heat dissipation. Packaging includes bonding an image sensor chip over a package substrate and electrically coupling the image sensor chip to the package substrate. Further, a housing structure is formed over the image sensor chip to encapsulate the image sensor chip with the package substrate. The completed package can then bonded and/or electrically coupled to a flexible printed circuit (FPC) and/or to an external device.

Some optical components are inserted between the housing structure and the image sensor chip during the packaging process to get good quality image. Those optical components may include a set of module lens for radiation guidance and imaging, an infrared cut off filter to filter infrared light, and a cover glass for dust protection. Also, a light shield is arranged along sidewalls of the packaged image sensor chip to block unwanted light. However, the utilization of these optical components results in high cost and lager package size, which is unfavorable for applications like mobile and medical use.

In view of the foregoing, the present disclosure is directed to a new image sensor package and improved method for packaging image sensor chips. The improved method forms on-wafer protection layer(s) and optical components at the wafer level prior to separating the wafer or the bulk substrates to discrete dies. The improved method may also form openings between the dies and fill the opening with light shield material at the wafer level to form on-wafer light shield structures along sidewalls of the image sensor chips. By replacing varies protection and optical components of the individual image sensor packages with corresponding on-wafer components, those on-wafer protection and optical components are formed directly on the image sensor chips at the wafer level. Thus, the manufacturing process is simplified, the size and height of the package are reduced, and the performance of the image sensor is improved.

With reference to FIG. 1, a cross-sectional view 100 of an image sensor package according to some embodiments is provided. The image sensor package includes an image sensor chip 102 disposed on a package substrate 106. In some embodiments, the package substrate 106 is a bulk semiconductor substrate or a silicon-on-insulator (SOI) substrate. In other embodiments, the package substrate 106 is another chip or integrated circuit. In some embodiments, the image sensor chip 102 is one of a charge-coupled device (CCD), a complementary metal oxide semiconductor (CMOS) device, or a BSI device. In other embodiments, the image sensor chip 102 can be replaced with another type of chip. Other types of chips include memory chips (e.g., flash memory chips), radio frequency (RF) chips, and so on.

An on-wafer shield structure 104 is spaced around the periphery of the image sensor chip 102 on the package substrate 106 and along the sidewalls of the image sensor chip 102. A protection layer 110 is arranged to cover the image sensor chip 102. The protection layer 110 may have a sidewall directly contacts a sidewall of the on-wafer shield structure 104. The protection layer 110 may have a planar top surfaces aligned with that of the on-wafer shield structure 104. The protection layer 110 may have a bottom surface lining and contacting structures under the protection layer 110. The protection layer 110 may comprise photoresist, float glass, fused silica, silicon, germanium, acrylic resin or other applicable materials.

In some embodiments, an on-wafer lens 108 is arranged above the image sensor chip 102 and under the protection layer 110. In some embodiments, the on-wafer lens 108 may extend laterally to the on-wafer shield structure 104. In some alternative embodiments, the on-wafer lens 108 may have top and sidewall surfaces covered by the protection layer 110. The on-wafer shield structure 104 may directly attach to the on-wafer lens 108. Though the on-wafer lens 108 is shown as a single convex lens in the figure, it is appreciated that the on-wafer lens 108 can include multiple lens and can have other shapes.

In some embodiments, an on-wafer filtering coating 130 is arranged above the image sensor chip 102 and under the protection layer 110. The on-wafer filtering coating 130 may be arranged above or under the on-wafer lens 108. The on-wafer filtering coating 130 is configured to filter a certain range of radiance spectrum. As an example, the on-wafer filtering coating 130 may be an infrared cut off filter that are designed to reflect or block mid-infrared wavelengths while passing visible light. The on-wafer filtering coatings 130 or the on-wafer lens 108 may be photoresist, float glass, fused silica, silicon, germanium, acrylic resin, pigments or other applicable materials.

In some embodiments, a housing structure encloses the protection layer 110 and other on-wafer structures above the image sensor chip 102. As an example, a first housing structure 112 is arranged on the on-wafer shield structure 104. The first housing structure 112 extends laterally inward over the image sensor chip 102, to define a first aperture 114, typically circular in shape, over the image sensor chip 102 between the sidewall of the lateral extension. A second housing structure 122 is arranged, typically removably arranged, in the first aperture 114. The second housing structure 122 includes a second aperture 126, typically circular in shape, over the image sensor chip 102. Within the second aperture 126, a module lens 128 including one or more lenses are arranged. The module lens 128 is designed to focus light on to the image sensor chip 102 and is secured to the second housing structure 122.

Though not shown in the figure, a bonding structure may be arranged between image sensor chip 102 and the package substrate 106 to bond and/or electrically couple the image sensor chip 102 to the package substrate 106, and/or to electrically couple the image sensor chip 102 or the package substrate 106 to an external device and/or external bond pads (not shown). The bonding structure can be a solder ball, but other types of bonding structures are amenable.

The height of the image sensor package can be reduced since a discrete cover glass or an infrared filter and corresponding intervening materials are no longer needed since being replaced by the build in protection layer 110 and/or the on-wafer filtering coating 130. One or more lenses of a module lens for the image sensor package can also be omitted or reduced since the on-wafer lens 108 may be installed. Further, the size of the image sensor package can be reduced since a discrete light shield and corresponding intervening materials are no longer needed since being replaced by the build in on wafer light shield structure 104. For example, the size and the height of the image sensor package can be reduced to chip-scale (i.e., no larger than 1.2 times the size of the chip). Even more, assembly of the image sensor package can be simplified since minimal changes are needed to the layout of the image sensor chip.

Figure 2:
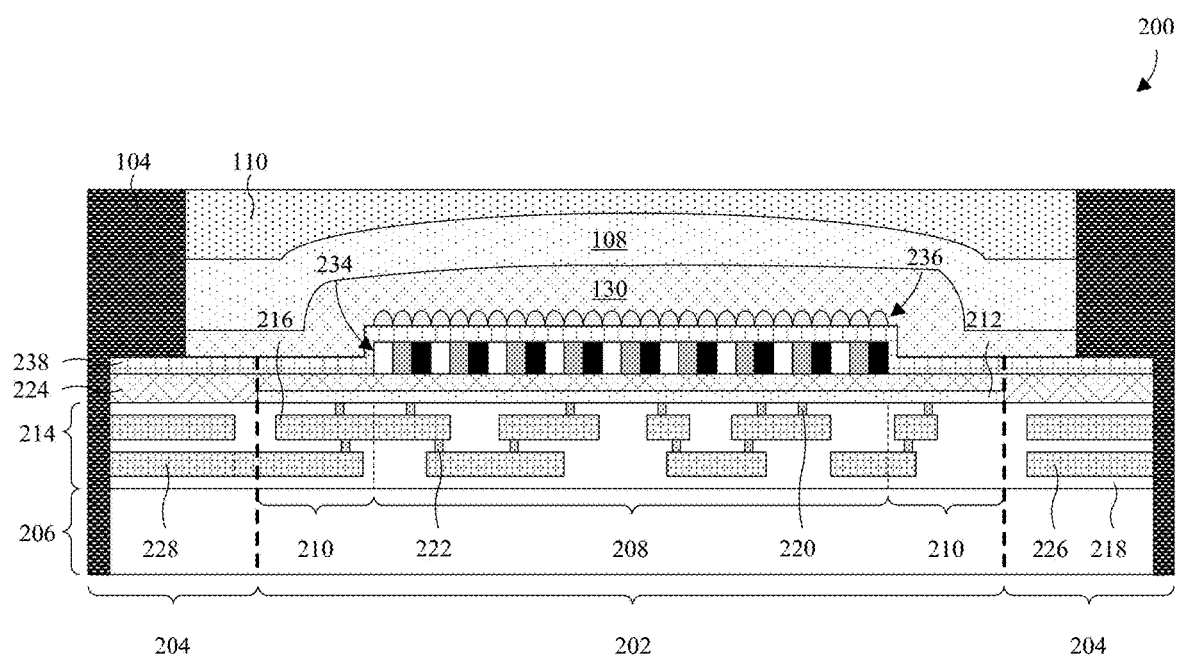
FIG. 2 illustrates a cross-sectional view of some embodiments of an image sensor chip according to FIG. 1.

With reference to FIG. 2, a cross-sectional 200 of an image sensor chip according to some embodiments is provided. The image sensor chip is suitable for use as the image sensor chip 102 of FIG. 1. The image sensor chip includes an integrated circuit (IC) region 202 having an IC circuit for image sensing and an edge region 204 surrounding the IC region 202 for external connection to a package substrate and/or external device. As some examples, the image sensor chip can be a CCD device, a CMOS device, or a BSI device.

A first substrate 206 supports a pixel sensor array 208, such as active pixel sensors, and a supporting logic circuit 210 (collectively the IC circuit) within the IC region 202. The first substrate 206 is, for example, a bulk substrate of silicon, germanium, or group III and group V elements. Alternatively, the first substrate 206 is, for example, a SOI substrate. The pixel sensors are unit devices for the conversion of an optical image into digital data and correspond to the smallest areas to which light incident on the pixel sensor array 208 can be localized therein. The supporting logic circuit 210 supports readout of the pixel sensor array 208. The supporting logic circuit 210 may be arranged around the periphery of the pixel sensor array 208.

A device layer 212 and a metallization stack 214 are arranged over and/or with the first substrate 206 to collectively form the pixel sensor array 208 and the supporting logic circuit 210. The device layer 212 includes electronic devices, such as transistors, resistors, capacitors, photodiodes, etc., of the image sensor chip. The device layer 212 typically includes photodetectors, such as photodiodes, for the pixel sensor array 208 and transistors for the supporting logic circuit 210. The metallization stack 214 interconnects the electronic devices by one or more metallization layers 216 arranged within an interlayer dielectric (ILD) layer 218. One or more contacts 220 electrically couple the device layer 212 to the metallization layers 216, and one or more vias 222 electrically couple the metallization layers 216 to each other.

In some embodiments, as illustrated, the device layer 212 is arranged over the metallization stack 214 on a bottom surface of and/or within a second substrate 224. In other embodiments, the second substrate 224 is omitted and the device layer 212 is arranged below the metallization stack 214 on a top surface of and/or within the first substrate 206. The second substrate 224 may be employed where the image sensor chip is a BSI device, such that the first substrate 206 serves as a carrier substrate and the second substrate 224 serves as an image sensor substrate. The second substrate 224 is, for example, a bulk substrate of silicon, germanium, or group III and group V elements. Alternatively, the second substrate 224 is, for example, a SOI substrate.

In some embodiments, a color filter array 234 may be arranged over the pixel sensor array 208 and a micro lens array 236 is arranged over the color filter array 234. The color filter array 234 is a mosaic of tiny color filters placed to assign colors to the pixel sensors, because pixel sensors are unable to distinguish between light of different colors. For example, the color filter array 234 is a Bayer filter. A Bayer filter includes a mosaic of red, green and blue filters arranged in a filter pattern of 50% green, 25% red, and 25% blue. Such an arrangement of filters is advantageous because red, green, and blue can be mixed in different combinations to produce most of the colors visible to the human eye. The micro lens array 236 focuses light through a color filter array 234 to the pixel sensor array 208. In some alternative embodiments, a color filter array is absent, and the micro lens array 236 overlies the pixel sensor array 208 and focuses light to the pixel sensor array 208.

In some embodiments, a flatness layer 238 may be arranged between the color filter array 234 and the micro lens array 236. The flatness layer 238 may be arranged over a top surface of the second substrate 224 and/or the metallization stack 214. The flatness layer 238 smoothes the top surface of the color filter array 234 to reduce surface roughness of the color filter array 234 and to reduce topographical differences between micro lenses of the micro lens array 236. The flatness layer 238 is transparent and includes, for example, silicon oxide or aluminum oxide.

Image sensor bond pads 226 are arranged within the ILD layer 218 and the edge region 204 along sidewalls of the image sensor chip. The image sensor bond pads 226 are electrically coupled to the IC region 202 through the metallization stack 214. The image sensor bond pads 226 include one or more external bond pads to electrically couple the device layer 212 to external devices for normal use and one or more testing bond pads for wafer acceptance testing (WAT) or circuit probing.

Similar as discussed in FIG. 1 above, the on-wafer shield structure 104 is arranged around the periphery of the image sensor chip to define sidewalls of the image sensor chip. The on-wafer shield structure 104 may comprise a narrower lower portion and a wider upper portion. The narrower lower portion lines the first substrate 206, the metallization stack 214, the second substrate 224/the device layer 212, and optionally the flatness layer 238. The wider upper portion lines the on-wafer filtering coating 130, the on-wafer lens 108, and the protection layer 110. The on-wafer shield structure 104 and the protection layer 110 may have aligned planar top surfaces.

Figure 3:
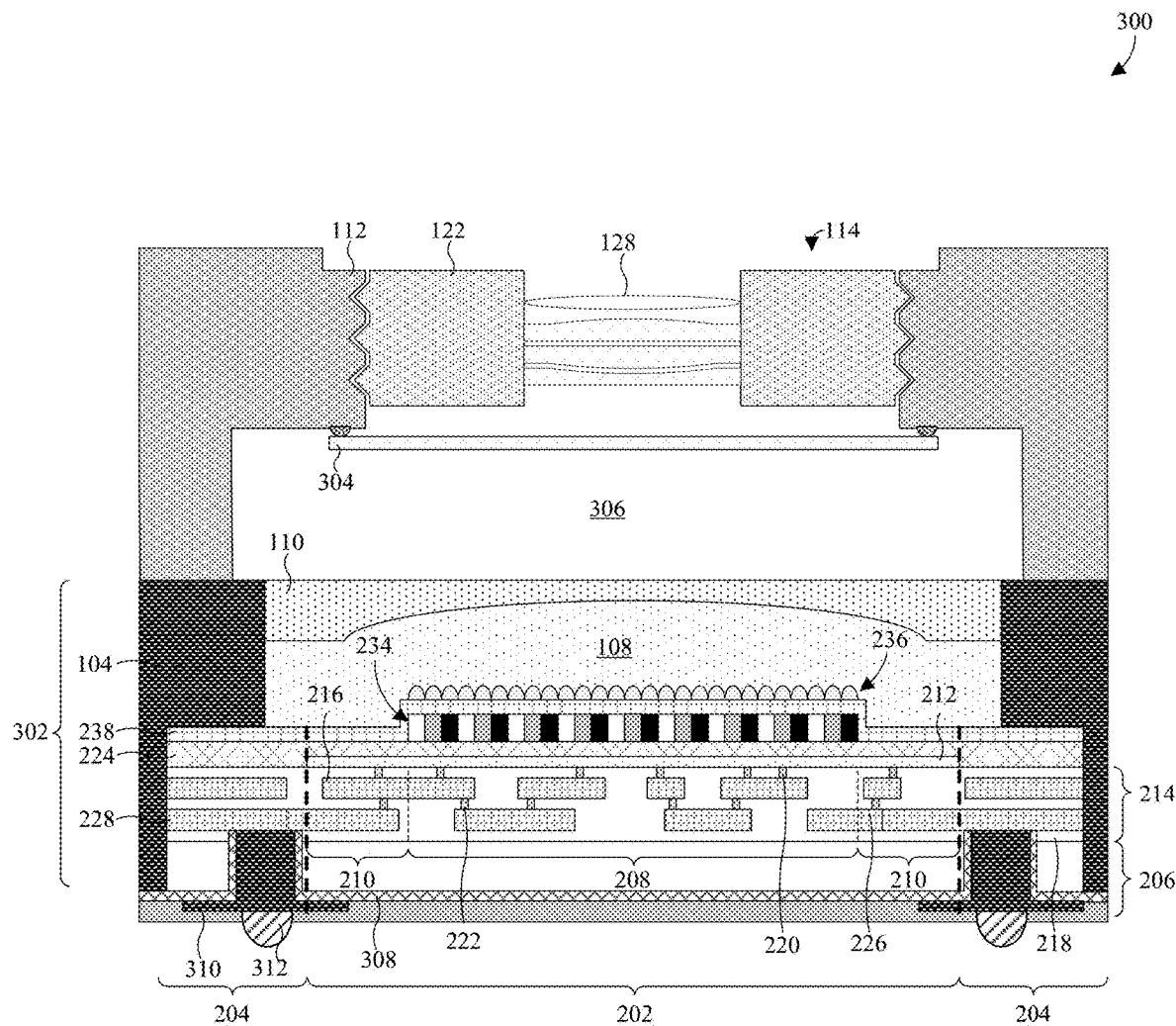
FIG. 3 illustrates a cross-sectional view of alternative embodiments of an image sensor package having an image sensor chip.

With reference to FIG. 3, a cross-sectional view 300 of an image sensor package is provided according to alternative embodiments. The image sensor package includes an image sensor chip 302 with a filter plate 304, such as a glass plate, arranged along the top of the image sensor chip 302 to define a cavity 306 within the image sensor chip 302. The cavity is suitably arranged over a sensing region of the image sensor chip 302. In some embodiments, the image sensor chip 302 is one of a CCD, a CMOS device, or a BSI device. A passivation layer 308 of the image sensor chip 302 is arranged along a bottom of the image sensor chip 302. The passivation layer 308 lines TSV holes in the bottom of the image sensor chip 302. A conductive layer is filled in the TSV and defines a through substrate via (TSV) 310. A bonding and/or electrical coupling (B/EC) structure 312 is arranged at the bottom of the image sensor chip 302 coupling to the TSV 310 to bond and/or electrically couple the image sensor chip 302 to the external device and/or substrate through the TSV 310. The B/EC structure 312 is typically solder balls, but other types of bonding structures are amenable.

Similar as described in FIG. 1 and FIG. 2, the first housing structure 112 is arranged on and around the periphery of the image sensor chip 302. The first housing structure 112 extends vertically above the image sensor chip 302 and laterally inward over the image sensor chip 302, to define a first aperture 114. The second housing structure 122 is arranged, typically removably arranged, in the first aperture 114. A module lens 128 including one or more lenses is arranged within the second housing structure 122. The module lens 128 is designed to focus light on to the image sensor chip 302. By having the on-wafer shield structure 104 replacing a die level light shield around the periphery of the image sensor chip 302, the lateral size of the image sensor package is advantage reduced. By having the protection layer 110 directly on the image sensor chip 302, a cover glass is omitted, and the height of the image sensor package is advantage reduced. By having one or more on-wafer lens 108 directly on the image sensor chip 302, the module lens 128 is reduced or omitted, and the imaging quality is improved.

Figure 4:
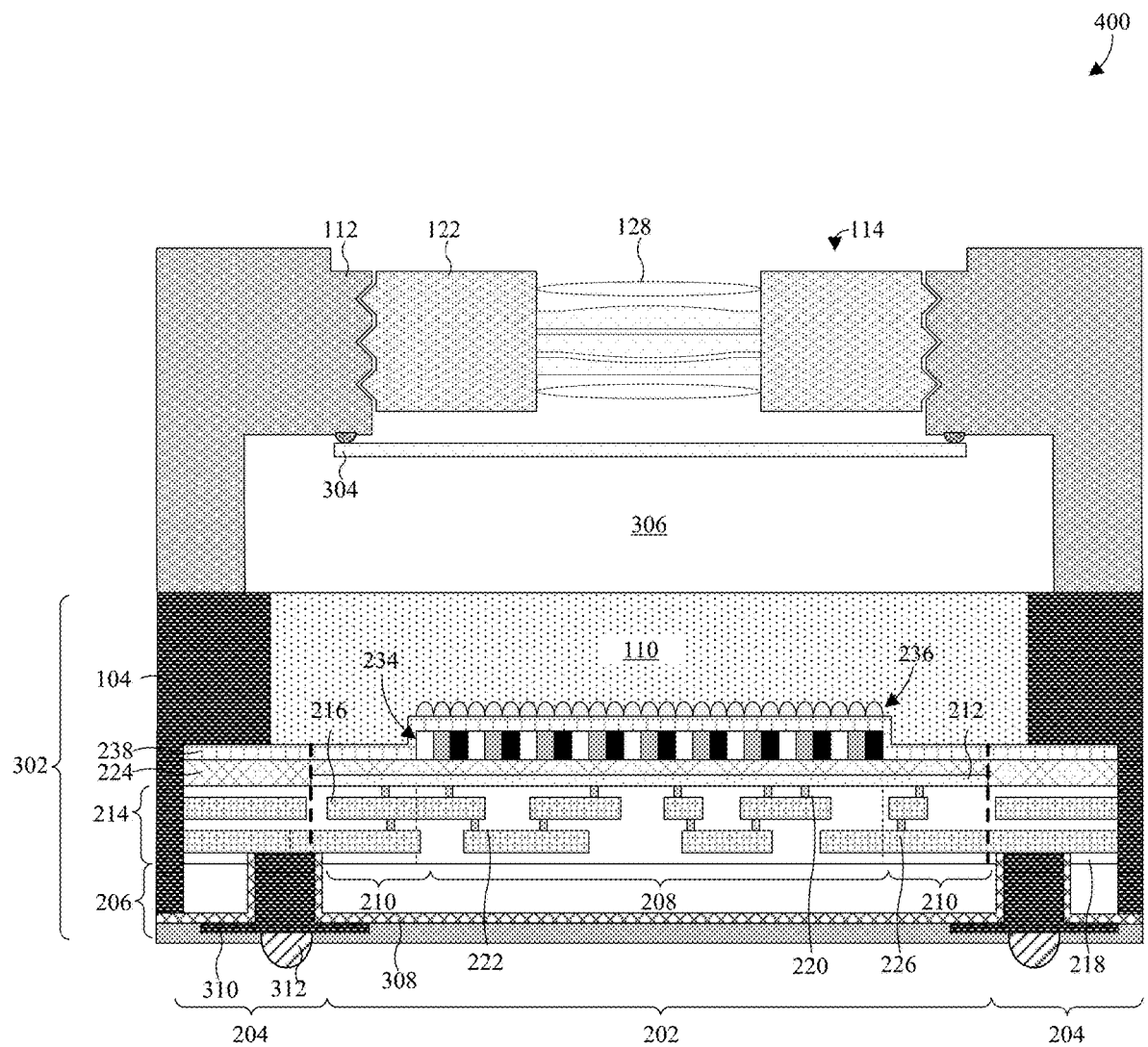
FIG. 4 illustrates a cross-sectional view of alternative embodiments of an image sensor package having an image sensor chip.

With reference to FIG. 4, a cross-sectional view 400 of an image sensor package is provided according to alternative embodiments of FIGS. 1-3. By having the protection layer 110 directly on the image sensor chip 302, a cover glass is omitted, and the height of the image sensor package is advantage reduced. By having the on-wafer shield structure 104 replacing a die level light shield around the periphery of the image sensor chip, the lateral size of the image sensor package is advantage reduced.

FIGS. 5-17 illustrate a series of cross-sectional views and top views of an integrated circuit device at various stages of manufacture according to some embodiments.

Figure 5:
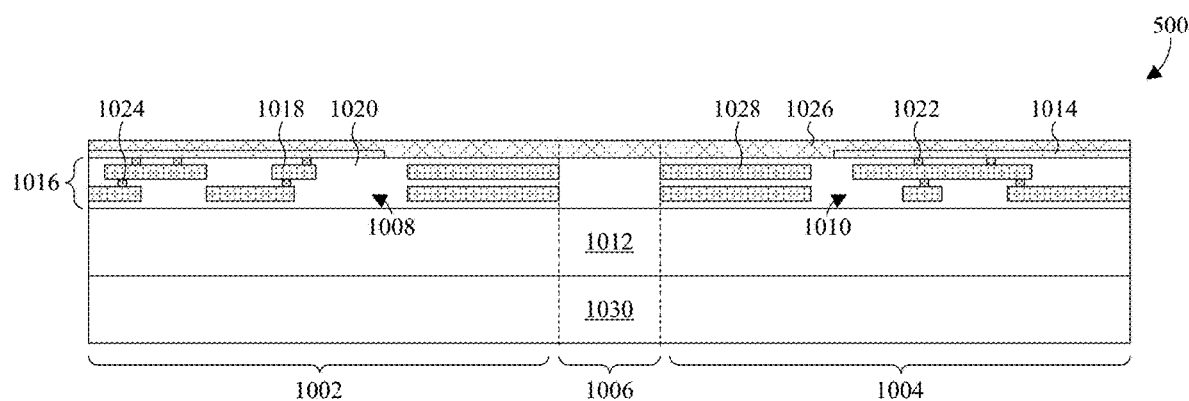
FIGS. 5-17 illustrate a series of cross-sectional and top views of some embodiments of image sensor chip at various stages of manufacture.

As shown in a cross-sectional view 500 of FIG. 5, a semiconductor structure having a plurality of image sensor dies including a first image sensor die 1002 and a second image sensor die 1004 is provided. The first and second image sensor dies 1002, 1004 correspond to non-overlapping regions of the semiconductor structure, and are spaced with a scribe line region 1006 arranged between the first and second image sensor dies 1002, 1004. The first and second image sensor dies 1002, 1004 include corresponding ICs 1008, 1010 for sensing and/or measuring light incident on the first and second image sensor dies 1002, 1004. The ICs 1008, 1010 correspond to, for example, CCD devices, CMOS devices, or BSI devices.

Arranged over and/or within a first substrate 1012, a device layer 1014 and a metallization stack 1016 collectively form the ICs 1008, 1010. The first substrate 1012 is, for example, a bulk semiconductor substrate of silicon, germanium, or group III and group V elements. Alternatively, the first substrate 1012 is, for example, a SOI substrate. The device layer 1014 includes electronic devices, such as transistors, resistors, capacitors, photodiodes, etc. The metallization stack 1016 interconnects the electronic devices by one or more metallization layers 1018 arranged within an interlayer ILD layer 1020. One or more contacts 1022 electrically couple the device layer 1014 to the metallization layers 1018, and one or more vias 1024 electrically couple the metallization layers 1018 to each other.

In some embodiments, the device layer 1014 is arranged over the metallization stack 1016 on a bottom surface of and/or within a second substrate 1026. In other embodiments, the second substrate 1026 is omitted and the device layer 1014 is arranged below the metallization stack 1016 on a top surface of and/or within the first substrate 1012. The second substrate 1026 is, for example, a bulk semiconductor substrate of silicon, germanium, or group III and group V elements. Alternatively, the second substrate 1026 is, for example, a SOI substrate.

Image sensor bond pads 1028 are arranged within the ILD layer 1020 between the first and second image sensor dies 1002, 1004. The image sensor bond pads 1028 are electrically coupled to the device layer 1014 through the metallization stack 1016 to facilitate external connection of the first and second image sensor dies 1002, 1004 to external devices. The first and second image sensor dies 1002, 1004 include corresponding, non-overlapping regions of the image sensor bonds pads 1028 separated by the scribe line region 1006.

Figure 6:
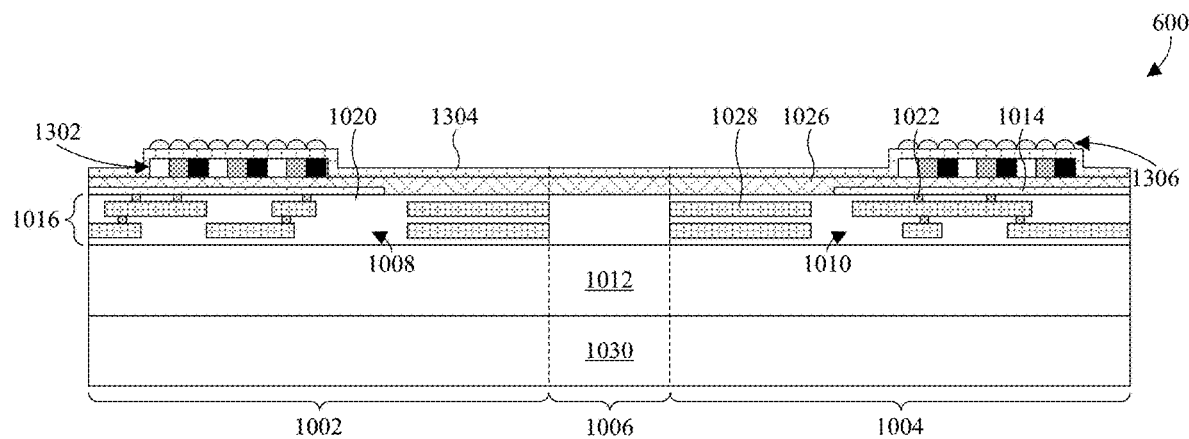
Figure 7:
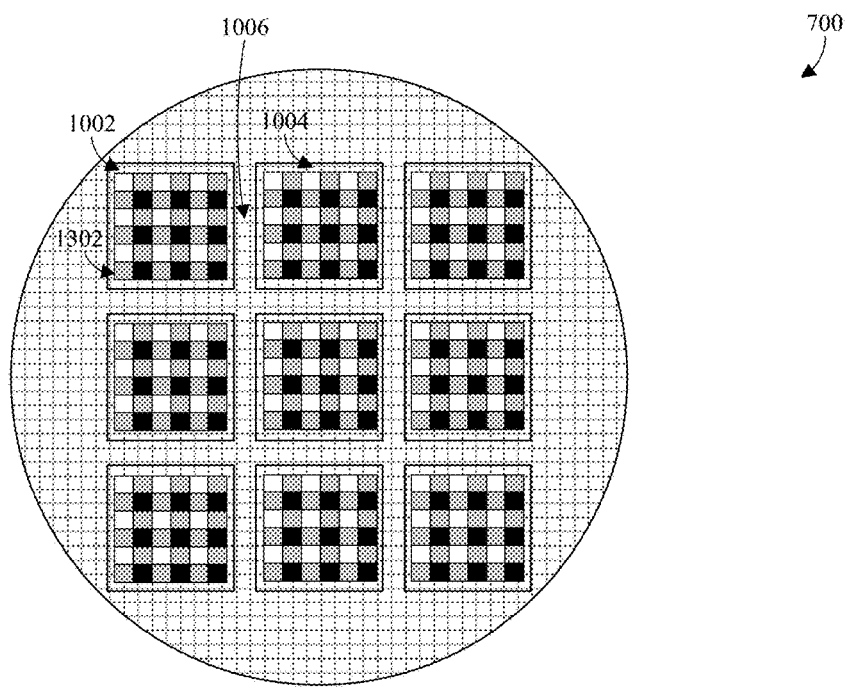

As shown in a cross-sectional view 600 of FIG. 6 and a top view 700 of FIG. 7, a plurality of color filter arrays 1302 corresponding to the plurality of image sensor dies are formed or otherwise arranged over sensing regions of the corresponding image sensor dies. In some embodiments, the color filter arrays 1302 are formed or otherwise arranged on the remaining second substrate 1026. In other embodiments, the color filter arrays 1302 are formed or otherwise arranged on the remaining metallization stack 1016 or the remaining ILD layer 1020. The color filter arrays 1302 are, for example, Bayer filters.

Also shown by FIG. 6, a flatness layer 1304 is formed over the color filter arrays 1302 and lining the second substrate 1026. The flatness layer 1304 smoothes the top surfaces of the color filter arrays 1302 to reduce surface roughness of the color filter arrays 1302 and may be transparent. In some embodiments, the flatness layer 1304 is or otherwise includes, for example, silicon oxide or aluminum oxide, and may be deposited by way of a vapor deposition technique (e.g., CVD, PE-CVD, PVD, etc.).

Also shown by FIG. 6, a plurality of micro lens arrays 1306 corresponding to the color filter arrays 1302 are formed or otherwise arranged over the color filter arrays 1302 and the flatness layer 1304. The micro lens arrays 1306 focus light through the flatness layer 1304 and the color filter arrays 1302 to the device layer 1014 for sensing by the ICs 1008, 1010.

Figure 8:
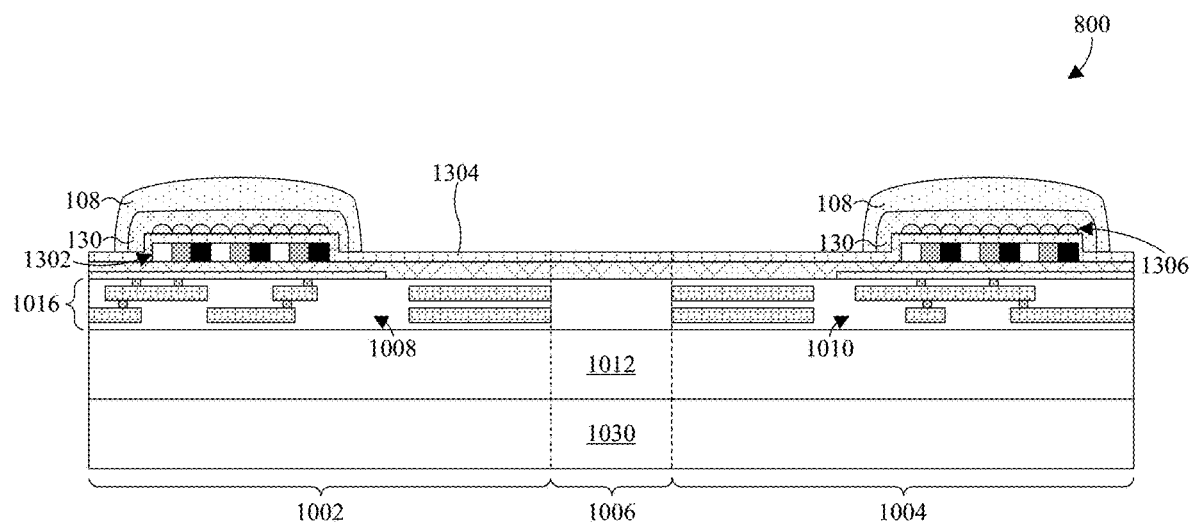
Figure 9:
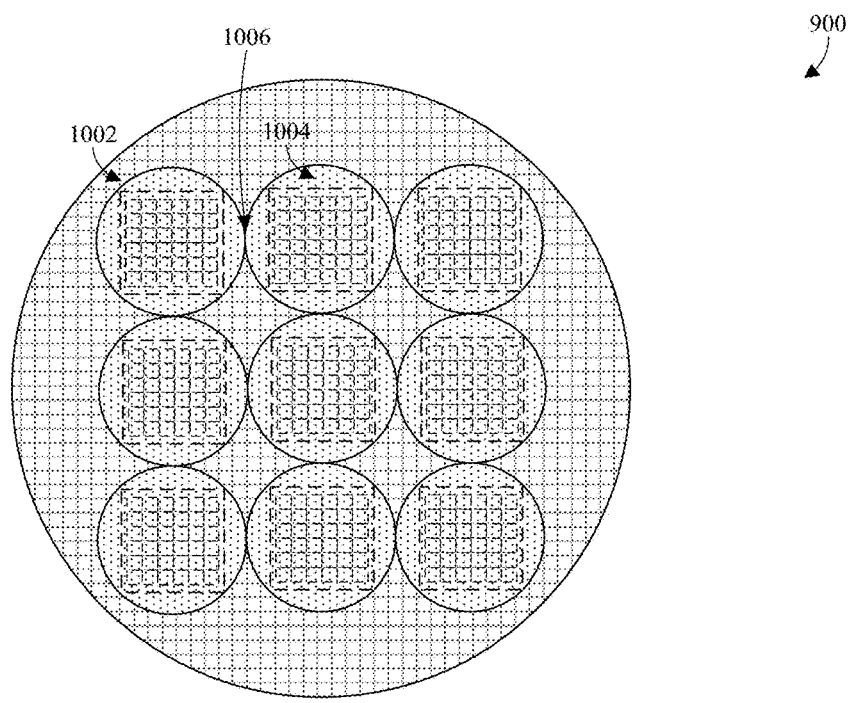

As shown in a cross-sectional view 800 of FIG. 8 and a top view 900 of FIG. 9, a plurality of on-wafer filtering coatings 130 and/or a plurality of on-wafer lens 108 are optionally formed or otherwise arranged over the color filter arrays 1302 and the micro lens arrays 1306. In some embodiments, the on-wafer filtering coatings 130 may be discrete from one another overlying the micro lens arrays 1306 as shown in FIG. 8. In some alternative embodiments, the on-wafer filtering coatings 130 may be portions of a first continuous physical layer and disposed on the micro lens arrays 1306. The first continuous physical layer lines the flatness layer 1304 between the color filter arrays 1302. In some embodiments, the on-wafer lens 108 may be discrete from one another and disposed on the on-wafer filtering coatings 130 as shown in FIG. 8. In some alternative embodiments, the on-wafer lens 108 may be convex portions of a second continuous physical layer disposed on the on-wafer filtering coatings 130 or the first continuous physical layer. Depending on applications, the on-wafer lens 108 may also be concave or planar shapes or other shapes that guide the incident light properly to reach on the color filter arrays 1302. The on-wafer lens 108 can also be absent. The on-wafer filtering coatings 130 or the on-wafer lens 108 may be photoresist, float glass, fused silica, silicon, germanium, or other applicable materials. The on-wafer filtering coatings 130 or the on-wafer lens 108 may be formed by molding or other patterning processes. In some embodiments, the on-wafer lens 108 is about 50 to 200 times thicker than the on-wafer filtering coatings 130. For example, the on-wafer filtering coatings 130 may have a thickness of about 1-2 μm, and the on-wafer lens 108 may have a thickness of about 100-200 μm.

Figure 10:
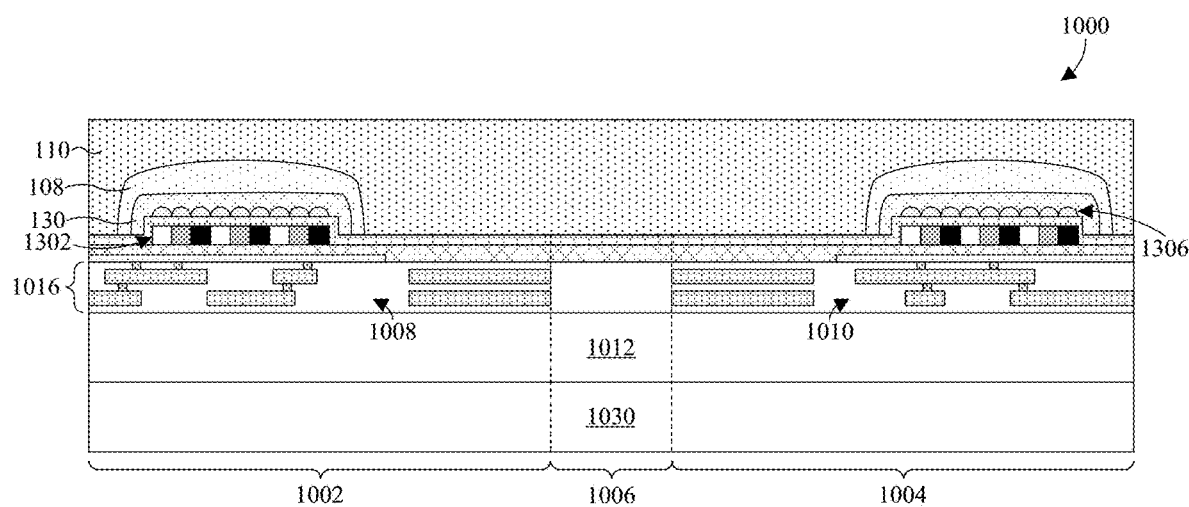
Figure 11:
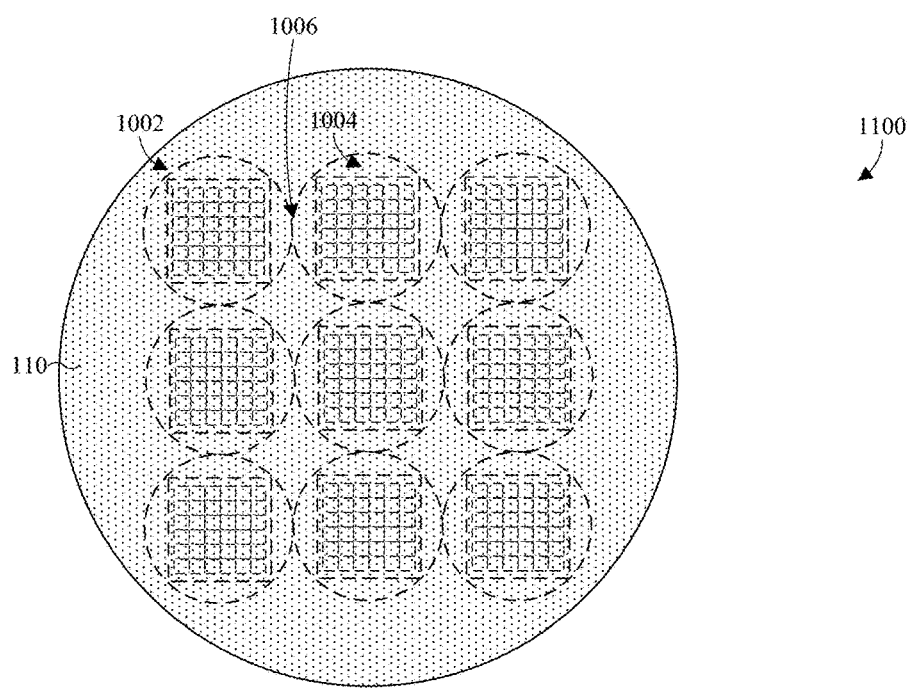

As shown in a cross-sectional view 1000 of FIG. 10 and a top view 1100 of FIG. 11, a protection layer 110 is formed or otherwise arranged over the color filter arrays 1302 and the micro lens arrays 1306. In some embodiments, the protection layer 110 is formed all cross the wafer with a planar top surface. The protection layer 110 may be photoresist, float glass, fused silica, silicon, germanium, acrylic resin, or other applicable materials. The protection layer 110 may be formed spin coating or deposition processes, for example, by a low temperature chemical-mechanical deposition process. In some embodiments, the protection layer 110 has a thickness greater than the on-wafer lens 108 from a top surface of the on-wafer lens 108 to the top surface of the protection layer 110. For example, the protection layer 110 may have a thickness of about 300 μm.

Figure 12:
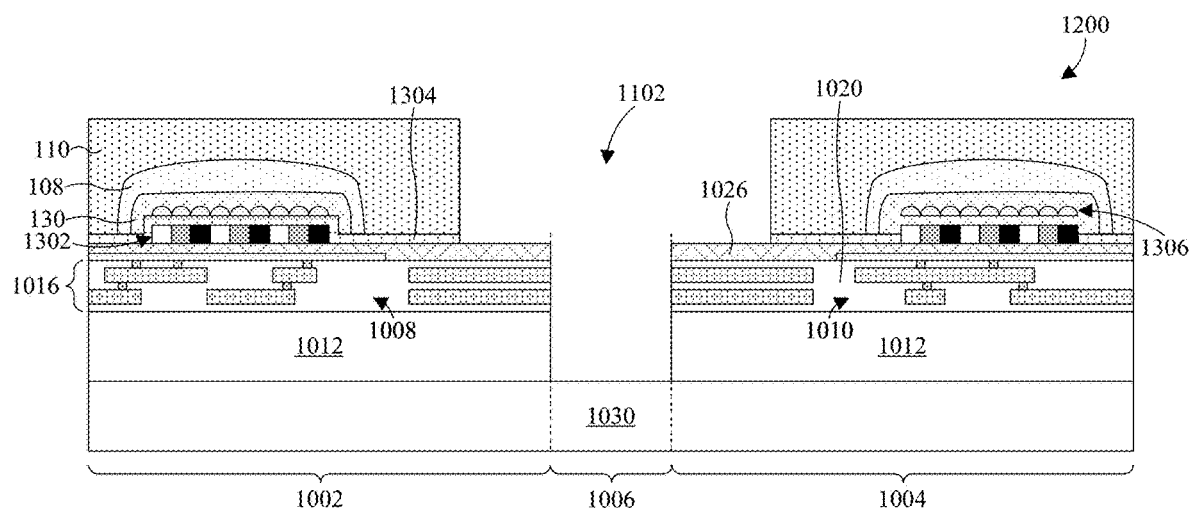
Figure 13:
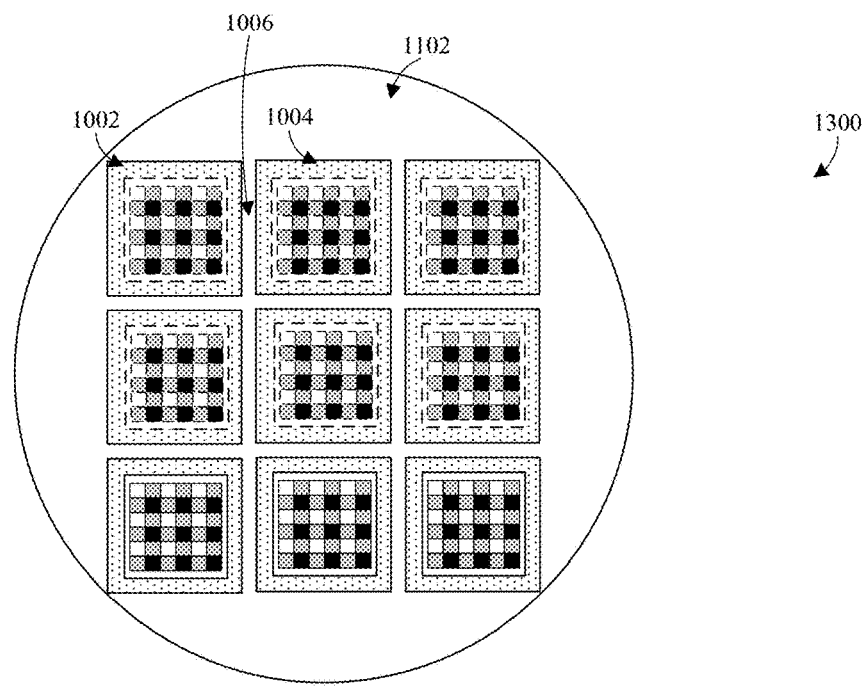

As shown in a cross-sectional view 1200 of FIG. 12 and a top view 1300 of FIG. 13, an opening 1102 is formed between the first and second image sensor die 1002, 1004. In some embodiments, a first etch is performed through select regions of the protection layer 110, the flatness layer 1304, the second substrate 1026, the metallization stack 1016, and/or the ILD layer 1020 to reach on the first substrate 1012 and form the opening 1102. The process for the first etch includes, for example, forming a first photoresist layer over a top surface of the protection layer 110, patterning the first photoresist layer, applying an etchant to the protection layer 110, the flatness layer 1304, the second substrate 1026, the metallization stack 1016, and/or the ILD layer 1020 to selectively etch areas that are not masked by the patterned first photoresist layer, and removing the patterned first photoresist layer. The opening 1102 may be formed to have a wider upper portion and a narrower lower portion as shown in FIG. 12. The opening 1102 may also be formed by a sawing process.

Figure 14:
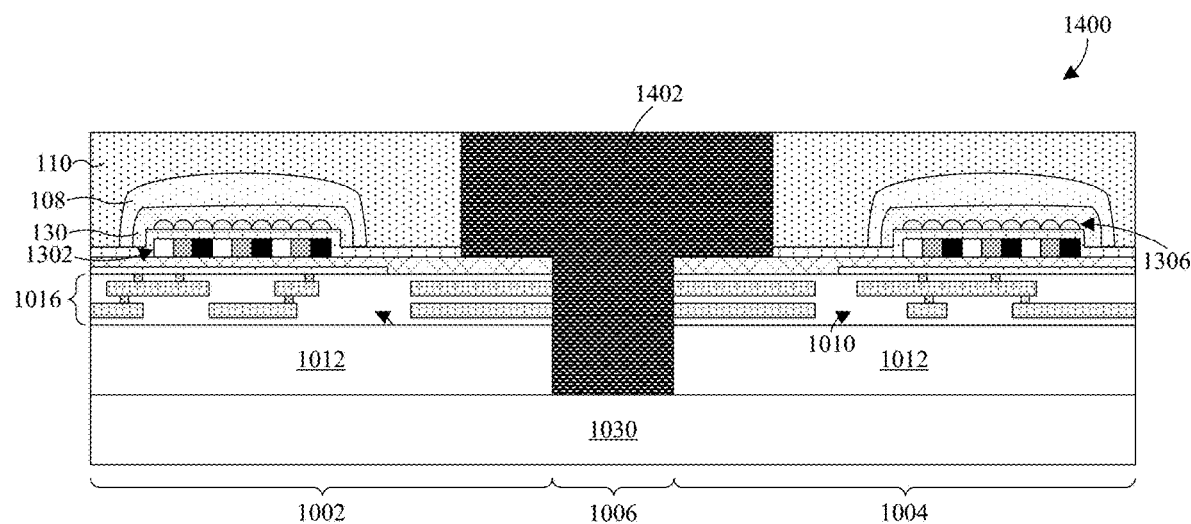
Figure 15:
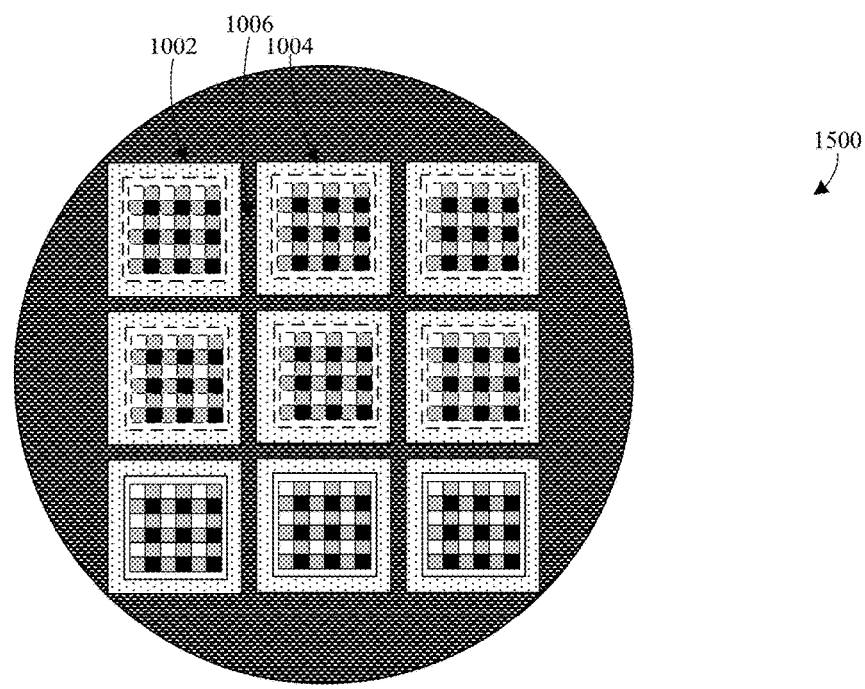

As shown in a cross-sectional view 1400 of FIG. 14 and a top view 1500 of FIG. 15, a filling layer 1402 is formed in the opening 1102 (see FIG. 12). The filling layer 1402 may be a light block material such as a black resin or other applicable materials. In some embodiments, the filling layer 1402 may be formed to have a top surface coplanar with that of the protection layer 110.

Figure 16:
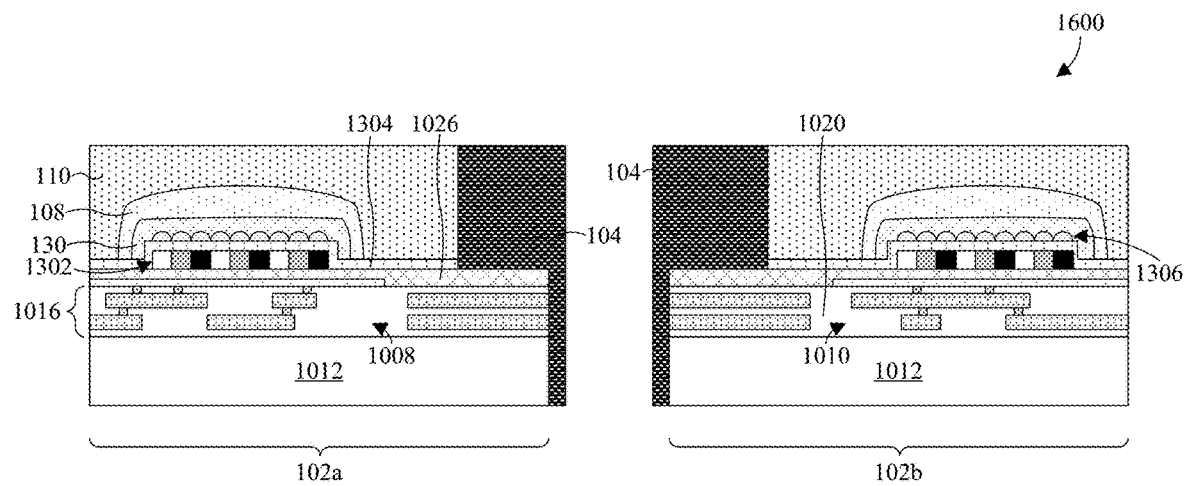

As shown in a cross-sectional view 1600 of FIG. 16, the first and second image sensor die 1002, 1004 are separated. In some embodiments, the separation is performed by moving a die saw along the scribe line region 1006 (see FIG. 14) through the filling layer 1402 and the first substrate 1012. The separation forms first and second image sensor chips 102a, 102b correspondingly including the remaining first and second image sensor dies and on-wafer light shield structures 104 from the remaining of the filing layer 1402 along the sidewalls of the first and second image sensor die. The carrier wafer 1030 (see FIG. 14) is then removed.

Figure 17:
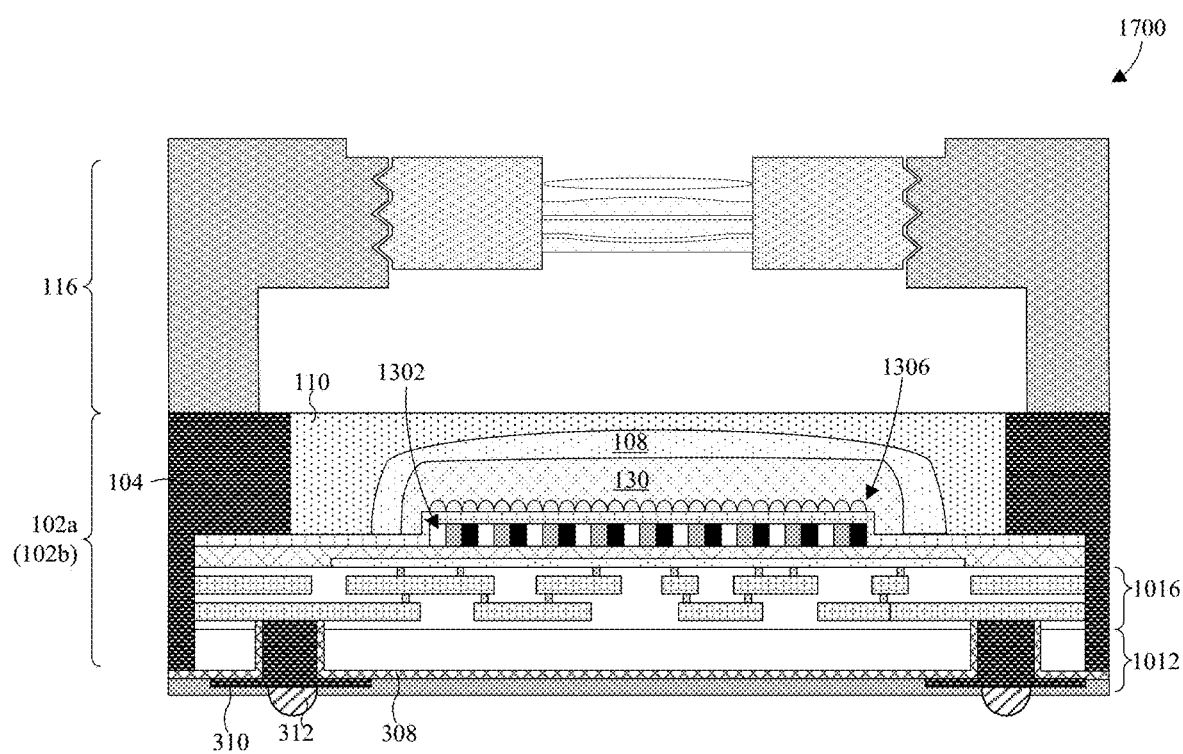

As shown in a cross-sectional view 1700 of FIG. 17, subsequent to the separation, the first and second image sensor chips 102a, 102b can be packaged. The image sensor chips can be soldered to a package substrate and/or to an external device by forming a B/EC structure 312 through the first substrate 1012. The image sensing chips can also be integrated to a camera module 116. Some examples of such packages and camera modules are shown and described in FIGS. 1-4 above.

Figure 18:
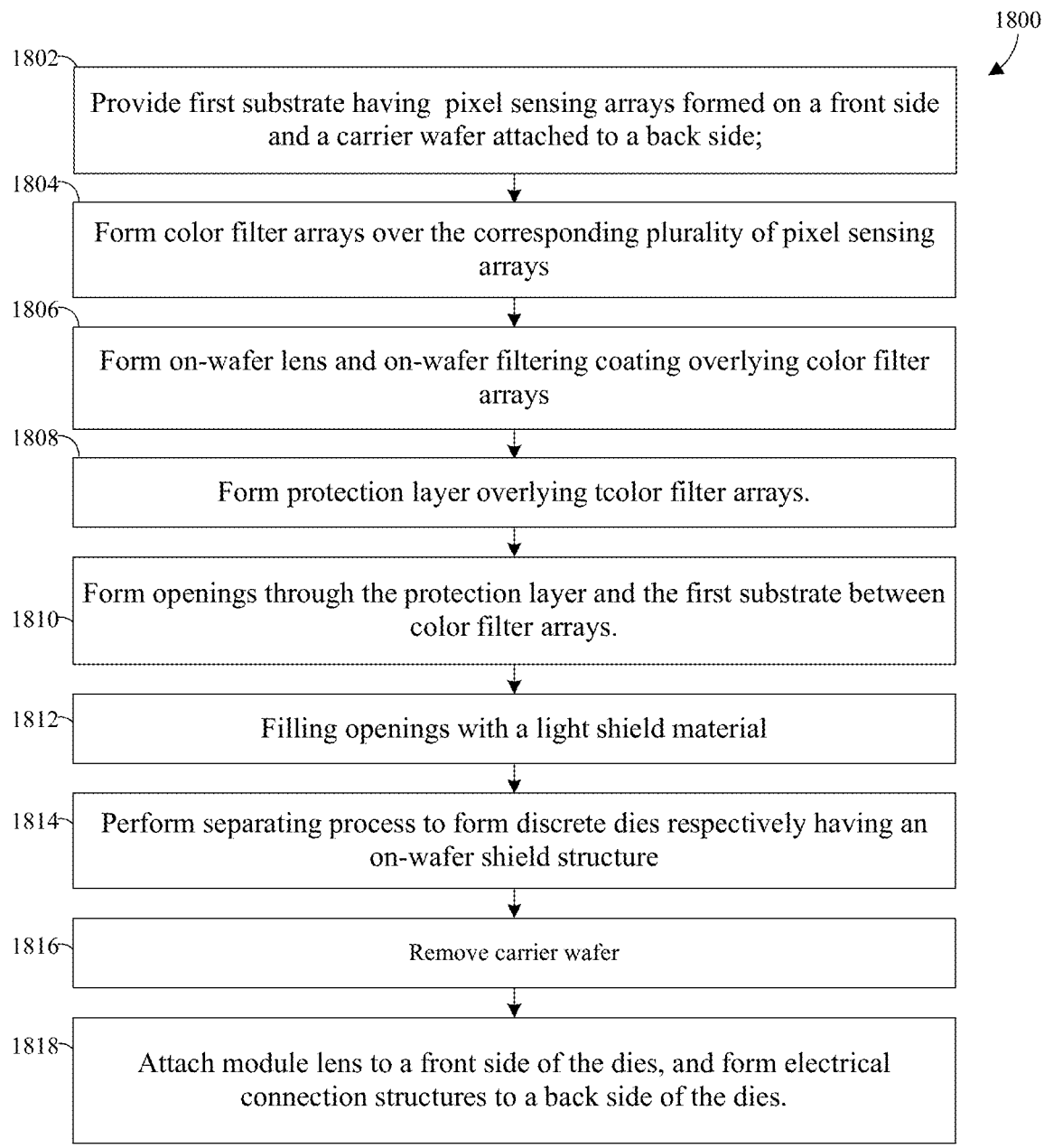
FIG. 18 illustrates a flow chart of some embodiments of a method for manufacturing an image sensor package having an image sensor chip.

FIG. 18 shows some embodiments of a flow diagram of a method 1800 of forming an integrated circuit device. Although method 1800 is described in relation to FIGS. 5-17, it will be appreciated that the method 1800 is not limited to such structures disclosed in FIGS. 5-17, but instead may stand alone independent of the structures disclosed in FIGS. 5-17. Similarly, it will be appreciated that the structures disclosed in FIGS. 5-17 are not limited to the method 1800, but instead may stand alone as structures independent of the method 1800. Also, while disclosed methods (e.g., method 1800) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, a first substrate is provided having a plurality of pixel sensing arrays on a front side and a carrier wafer attached to a back side. FIG. 5 shows some embodiments of a cross-sectional view 500 corresponding to act 1802.

At 1804, a plurality of color filter arrays is formed over the corresponding plurality of pixel sensing arrays. FIG. 6 and FIG. 7 show some embodiments of a cross-sectional view 600 and a top view 700 corresponding to act 1804.

At 1806, an on-wafer lens and an on-wafer filtering coating are formed overlying the color filter arrays. The on-wafer lens has a convex top surface. FIG. 8 and FIG. 9 show some embodiments of a cross-sectional view 800 and a top view 900 corresponding to act 1806.

At 1808, a protection layer is formed overlying the plurality of color filter arrays. FIG. 10 and FIG. 11 show some embodiments of a cross-sectional view 1000 and a top view 1100 corresponding to act 1808.

At 1810, a plurality of openings is formed through the protection layer and the first substrate between the color filter arrays. FIG. 12 and FIG. 13 show some embodiments of a cross-sectional view 1200 and a top view 1300 corresponding to act 1810.

At 1812, the openings are filled with a light shield material. FIG. 14 and FIG. 15 show some embodiments of a cross-sectional view 1400 and a top view 1500 corresponding to act 1812.

At 1814, a separating process is performed to the light shield material to form a plurality of discrete dies respectively having an on-wafer shield structure spaced around a periphery of the first substrate, the color filter array, and the protection layer. At 1816, the carrier wafer is removed. FIG. 16 shows some embodiments of a cross-sectional view 1600 corresponding to act 1814 and act 1816.

At 1818, a module lens is attached to a front side of the dies, and an electrical connection structure is formed to a back side of the dies. FIG. 17 shows some embodiments of a cross-sectional view 1700 corresponding to act 1818.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

Thus, as can be appreciated from above, the present disclosure relates to an integrated circuit device. The integrated circuit device comprises a package substrate, and an image sensor chip arranged over the package substrate. The integrated circuit device further comprises a protection layer overlying the image sensor chip having a planar top surface and a bottom surface lining and contacting structures under the protection layer, and an on-wafer shield structure spaced around a periphery of the image sensor chip. The on-wafer shield structure has a sidewall directly contact the protection layer.

In another embodiment, the present disclosure relates a method of manufacturing an integrated circuit (IC). The method comprises providing a first substrate having a plurality of pixel sensing arrays formed on a front side and a carrier wafer attached to a back side and forming a plurality of color filter arrays over the corresponding plurality of pixel sensing arrays. The method further comprises forming a protection layer overlying the plurality of color filter arrays. The method further comprises forming openings through the protection layer and the first substrate between the filter arrays and filling the openings with a light shield material. The method further comprises performing a separating process to the light shield material to form a plurality of discrete dies respectively having an on-wafer shield structure spaced around a periphery of the first substrate, the color filter array, and the protection layer.

In yet another embodiment, the present disclosure relates to an integrated circuit device. The integrated circuit device comprises a first substrate and a metallization stack disposed over the first substrate. The integrated circuit device further comprises a device layer disposed over the metallization stack and having a pixel sensing array disposed therein. The integrated circuit device further comprises a color filter array disposed over the pixel sensing array and a micro lens array disposed over the color filter array. The integrated circuit device further comprises a protection layer overlying the micro lens array an on-wafer shield structure spaced around a periphery of the image sensor package and comprising a lower portion surrounding and contacting the first substrate and an upper portion contacting the protection layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor package, comprising:
   a package substrate;
   an image sensor chip arranged over the package substrate and comprising a device layer having a pixel sensing array disposed therein, a color filter array disposed over a topmost surface of the device layer, and a micro lens array disposed over the color filter array;
   a protection layer overlying the micro lens array and having a planar top surface and a bottom surface lining and directly contacting structures under the protection layer;
   an on-wafer lens having a convex top surface and arranged above the micro lens array and under the protection layer; and
   an on-wafer shield structure of single material spaced around a periphery of the image sensor chip and having a sidewall directly contacting sidewalls of the protection layer and the device layer;
   wherein the on-wafer lens has a sidewall that directly contacts the sidewall of the on-wafer shield structure.

2. The image sensor package according to claim 1, wherein the planar top surface of the protection layer is aligned with a top surface of the on-wafer shield structure.

3. The image sensor package according to claim 1, further comprising:
   an on-wafer filtering coating arranged above the image sensor chip and under the on-wafer lens;
   wherein the on-wafer filtering coating is configured to filter infrared light.

4. The image sensor package according to claim 3, wherein the on-wafer filtering coating has a sidewall that directly contacts the sidewall of the on-wafer shield structure.

5. The image sensor package according to claim 1, wherein the protection layer directly contacts the micro lens array.

6. The image sensor package according to claim 1, further comprising:
   a flatness layer arranged between the color filter array and the micro lens array,
   wherein the flatness layer has a sidewall directly contacting the sidewall of the on-wafer shield structure.

7. The image sensor package according to claim 1, wherein the on-wafer shield structure comprises an upper portion and a lower portion, wherein the upper portion is wider than or equal to the lower portion.

8. The image sensor package according to claim 7, wherein the lower portion directly contacts sidewalls of the package substrate, a metallization stack between the package substrate and the device layer, and the device layer.

9. The image sensor package according to claim 7, wherein the upper portion sits on and has a bottom surface directly contacting a top surface of a flatness layer arranged between the color filter array and the micro lens array.

10. An image sensor package, comprising:
    a first substrate;
    a metallization stack disposed over the first substrate;
    a device layer disposed over the metallization stack and having a pixel sensing array disposed therein;
    a color filter array disposed over the pixel sensing array;
    a micro lens array disposed over the color filter array;
    a protection layer overlying the micro lens array;
    an on-wafer lens having a convex top surface and an on-wafer filtering coating configured to filter infrared light, the on-wafer lens and the on-wafer filtering coating arranged between the micro lens array and the protection layer; and
    a seamless on-wafer shield structure spaced around a periphery of the image sensor package and comprising a lower portion surrounding and directly contacting sidewalls of the first substrate and an upper portion wider than the lower portion and directly contacting sidewalls of the protection layer;
    wherein the on-wafer filtering coating has a sidewall that directly contacts a sidewall of the seamless on-wafer shield structure.

11. The image sensor package according to claim 10, wherein the protection layer has a top surface aligned with a top surface of the seamless on-wafer shield structure.

12. The image sensor package according to claim 10, wherein a bottom surface of the on-wafer filtering coating, the on-wafer lens, or the protection layer is aligned with a bottom surface of the seamless on-wafer shield structure.

13. The image sensor package according to claim 10, wherein the upper portion of the seamless on-wafer shield structure is wider than the lower portion.

14. An image sensor, comprising:
    a first substrate having a pixel sensing array disposed on a front side;
    a color filter array disposed over the pixel sensing array;
    a micro lens array disposed over the color filter array;
    an on-wafer filtering coating arranged directly contacting the micro lens array;
    an on-wafer lens having a convex top surface and arranged directly contacting the on-wafer filtering coating;
    a module lens disposed over the micro lens array;
    a protection layer disposed on the convex top surface of the on-wafer lens; and
    an on-wafer shield structure spaced around and directly contacting sidewalls of the first substrate, the on-wafer lens, and the protection layer.

15. The image sensor according to claim 14, further comprising:
    additional module lens attached above the protection layer and the on-wafer shield structure; and
    electrical connection structures disposed through the first substrate and connected from a back side of the first substrate opposite to the front side.

16. The image sensor according to claim 14, wherein the on-wafer shield structure has a narrower lower portion adjoining the first substrate and a wider upper portion adjoining the protection layer.

17. The image sensor according to claim 14, wherein the on-wafer filtering coating has a sidewall that directly contacts a sidewall of the on-wafer shield structure.

18. The image sensor according to claim 14, further comprising a flatness layer arranged between the color filter array and the micro lens array.

19. The image sensor according to claim 18, wherein the flatness layer has a sidewall directly contacting a sidewall of the on-wafer shield structure.

20. The image sensor according to claim 18, wherein the on-wafer filtering coating has a bottom surface directly contacting the flatness layer.

* * * * *